US011923827B2

(12) United States Patent
Galipeau et al.

(10) Patent No.: US 11,923,827 B2
(45) Date of Patent: Mar. 5, 2024

(54) BULK ACOUSTIC WAVE RESONATOR STACKED ONTO AN INTEGRATED PASSIVE DEVICE

(71) Applicant: Qorvo US, Inc., Greensboro, NC (US)

(72) Inventors: Jeffery D. Galipeau, Apopka, FL (US); Kelly M. Lear, Longwood, FL (US)

(73) Assignee: Qorvo US, Inc., Greensboro, NC (US)

( * ) Notice: Subject to any disclaimer, the term of this patent is extended or adjusted under 35 U.S.C. 154(b) by 475 days.

(21) Appl. No.: 17/182,988

(22) Filed: Feb. 23, 2021

(65) Prior Publication Data
US 2022/0271736 A1 Aug. 25, 2022

(51) Int. Cl.
*H03H 9/54* (2006.01)
*H03H 3/02* (2006.01)
*H03H 9/05* (2006.01)

(52) U.S. Cl.
CPC .............. *H03H 9/542* (2013.01); *H03H 3/02* (2013.01); *H03H 9/0547* (2013.01)

(58) Field of Classification Search
CPC ........ H03H 9/542; H03H 3/02; H03H 9/0547; H03H 9/568; H03H 9/17; H03H 9/54; H03H 9/02015; H03H 7/1783; H03H 9/605; H03H 9/589; H03H 9/173; H03H 9/205; H03H 9/564; H03H 9/175; H03H 9/0211; H03H 9/131; H03H 3/04; H03H 9/02102; H03H 9/02125; H03H 9/02086; H03H 2003/021; H03H 9/13; H03H 9/0095; H03H 9/02118; H03H 9/0557; H03H 9/0561; H03H 9/02228; H03H 9/584; H03H 9/178; H03H 9/703; H03H 2003/0428; H03H 2003/0471; H03H 9/0571; H04B 1/40; H04B 1/38
See application file for complete search history.

(56) References Cited

U.S. PATENT DOCUMENTS

| | | | |
|---|---|---|---|
| 2016/0093578 A1* | 3/2016 | Penunuri | H01L 25/16 257/532 |
| 2018/0076794 A1* | 3/2018 | Khlat | H03H 9/0095 |
| 2020/0028493 A1* | 1/2020 | Ta | H03H 9/542 |
| 2020/0228094 A1* | 7/2020 | Kato | H04B 1/18 |
| 2020/0287520 A1* | 9/2020 | Kamgaing | H03H 9/1014 |
| 2021/0336604 A1* | 10/2021 | Yu | H03H 9/02559 |
| 2022/0021357 A1* | 1/2022 | Takeuchi | H04L 5/14 |
| 2022/0140814 A1* | 5/2022 | Dyer | H03H 9/205 333/187 |

* cited by examiner

*Primary Examiner* — Lincoln D Donovan
*Assistant Examiner* — Tyler J Pereny
(74) *Attorney, Agent, or Firm* — Withrow & Terranova, P.L.L.C.

(57) ABSTRACT

Disclosed is a Bulk Acoustic Wave (BAW) assist filter structure with a BAW resonator stacked onto an integrated passive device (IPD). In exemplary aspects disclosed herein, the BAW filter structure includes a transducer with electrodes and a piezoelectric layer between the electrodes. The IPD is electrically coupled to the BAW resonator and provides a high frequency of operation. In such a configuration, the BAW assist filter structure has a low insertion loss and mitigates electrical length parasitic loss due to the close electrically proximity of the BAW resonator stacked onto the IPD. Further, the BAW assist filter structure is able to filter high frequencies and provides improved filter performance and greater flexibility in design of a filter transfer function.

18 Claims, 12 Drawing Sheets

FIG. 11

BULK ACOUSTIC WAVE RESONATOR STACKED ONTO AN INTEGRATED PASSIVE DEVICE

FIELD OF THE DISCLOSURE

The present invention relates to a Bulk Acoustic Wave (BAW) assist filter structure with at least one BAW resonator stacked onto an integrated passive device for high-frequency processing.

BACKGROUND

Acoustic resonators, and particularly Bulk Acoustic Wave (BAW) resonators, are used in many high-frequency communication applications. In particular, BAW resonators are often employed in filter networks that operate at frequencies above 1.5 GHz and require a flat passband, have exceptionally steep filter skirts and squared shoulders at the upper and lower ends of the passband, and provide excellent rejection outside of the passband. BAW-based filters also have relatively low insertion loss, tend to decrease in size as the frequency of operation increases, and are relatively stable over wide temperature ranges. As such, BAW-based filters are the filter of choice for many 3rd Generation (3G), 4th Generation (4G), and 5th Generation (5G) wireless devices. Most of these wireless devices support cellular, wireless fidelity (Wi-Fi), Bluetooth, and/or near field communications on the same wireless device, and as such, pose extremely challenging filtering demands. While these demands keep raising the complexity of the wireless devices, there is a constant need to improve the performance of BAW resonators and BAW-based filters as well as decrease the cost and size associated therewith.

Currently, BAW-based filters have difficulties filtering signals above about 6 GHz. In particular, typically, as frequency increases, losses increase as well. Challenges remain for filtering at high frequencies with BAW-based filters.

SUMMARY

Embodiments of the disclosure are directed to a Bulk Acoustic Wave (BAW) assist filter structure with a BAW resonator stacked onto an integrated passive device (IPD). In exemplary aspects disclosed herein, the BAW filter structure includes a transducer with electrodes and a piezoelectric layer between the electrodes. The IPD is electrically coupled to the BAW resonator and provides a high frequency of operation. In such a configuration, the BAW assist filter structure has a low insertion loss and mitigates electrical length parasitic loss due to the close electrically proximity of the BAW resonator stacked onto the IPD. Further, the BAW assist filter structure is able to filter high frequencies and provides improved filter performance and greater flexibility in design of a filter transfer function.

One embodiment of the disclosure relates to a bulk acoustic wave (BAW) assist filter structure, including a laminate. The BAW assist filter structure further includes at least one integrated passive device (IPD) over the laminate. The at least one IPD includes an electrical circuit. The BAW assist filter structure further includes at least one BAW resonator over the IPD, including a substrate. The at least one BAW resonator further includes at least one transducer over the substrate. The at least one transducer includes a first electrode, a second electrode, and a piezoelectric layer between the first electrode and the second electrode. The electrical circuit of the at least one IPD is electrically coupled to the BAW resonator.

Another embodiment of the disclosure relates to a method of manufacturing a bulk acoustic wave (BAW) assist filter structure, including positioning at least one integrated passive device (IPD) over a laminate. The method further includes stacking at least one BAW resonator over the at least one IPD, the BAW resonator comprising a substrate, at least one transducer over the substrate. The at least one transducer includes a first electrode, a second electrode, and a piezoelectric layer between the first electrode and the second electrode. The method further includes electrically coupling the at least one BAW resonator to the electrical circuit of the at least one IPD.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description, serve to explain the principles of the disclosure.

DETAILED DESCRIPTION

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It should be understood that, although the terms first, second, etc., may be used herein to describe various elements, these elements should not be limited by these terms. These terms are only used to distinguish one element from another. For example, a first element could be termed a second element, and, similarly, a second element could be termed a first element without departing from the scope of the present disclosure. As used herein, the term "and/or" includes any and all combinations of one or more of the associated listed items.

It should also be understood that when an element is referred to as being "connected" or "coupled" to another element, it can be directly connected or coupled to the other element, or intervening elements may be present. In contrast, when an element is referred to as being "directly connected" or "directly coupled" to another element, there are no intervening elements present.

It should be understood that, although the terms "upper," "lower," "bottom," "intermediate," "middle," "top," and the like may be used herein to describe various elements, these elements should not be limited by these terms. These terms are only used to distinguish one element from another. For example, a first element could be termed an "upper" element, and, similarly, a second element could be termed an "upper" element depending on the relative orientations of these elements, without departing from the scope of the present disclosure.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having meanings that are consistent with their meanings in the context of this specification and the relevant art and will not be interpreted in an idealized or overly formal sense unless expressly so defined herein.

Embodiments of the disclosure are directed to a Bulk Acoustic Wave (BAW) assist filter structure with a BAW resonator stacked onto an integrated passive device (IPD). In exemplary aspects disclosed herein, the BAW filter structure includes a transducer with electrodes and a piezoelectric layer between the electrodes. The IPD is electrically coupled to the BAW resonator and provides a high-frequency of operation. In such a configuration, the BAW assist filter structure has a low insertion loss and mitigates electrical length parasitic loss due to the close electrical proximity of the BAW resonator stacked onto the IPD. Further, the BAW assist filter structure is able to filter high-frequencies and provides improved filter performance and greater flexibility in design of a filter transfer function.

Figure 1:
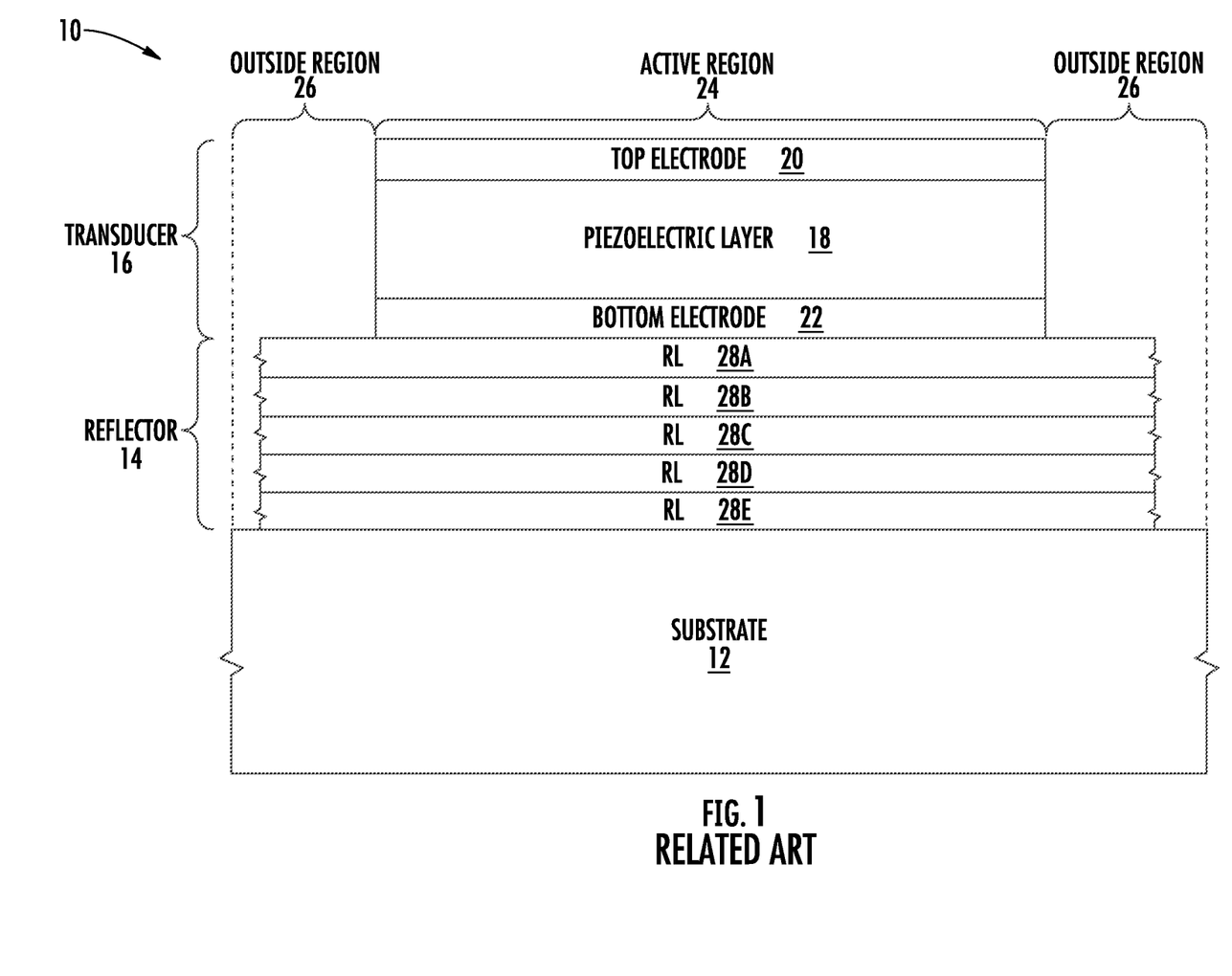
FIG. 1 illustrates a conventional Bulk Acoustic Wave (BAW) resonator.

Prior to delving into the details of these concepts, an overview of BAW resonators and filters that employ BAW resonators is provided. BAW resonators are used in many high-frequency filter applications. An exemplary BAW resonator 10 is illustrated in FIG. 1. The BAW resonator 10 is a solidly mounted resonator (SMR) type BAW resonator 10 and generally includes a substrate 12, a reflector 14 mounted over the substrate 12, and a transducer 16 mounted over the reflector 14. The transducer 16 rests on the reflector 14 and includes a piezoelectric layer 18, which is sandwiched between a top electrode 20 and a bottom electrode 22. The top and bottom electrodes 20, 22 may be formed of tungsten (W), molybdenum (Mo), platinum (Pt), or like material, and the piezoelectric layer 18 may be formed of aluminum nitride (AlN), zinc oxide (ZnO) or other appropriate piezoelectric material. Although shown in FIG. 1 as including a single layer, the piezoelectric layer 18, the top electrode 20, and/or the bottom electrode 22 may include multiple layers of the same material, multiple layers in which at least two layers are different materials, or multiple layers in which each layer is a different material.

The BAW resonator 10 is divided into an active region 24 and an outside region 26. The active region 24 generally corresponds to the section of the BAW resonator 10 where the top and bottom electrodes 20, 22 overlap and also includes the layers below the overlapping top and bottom electrodes 20, 22. The outside region 26 corresponds to the section of the BAW resonator 10 that surrounds the active region 24.

For the BAW resonator 10, applying electrical signals across the top electrode 20 and the bottom electrode 22 excites acoustic waves in the piezoelectric layer 18. These acoustic waves primarily propagate vertically. A primary goal in BAW resonator design is to confine these vertically-propagating acoustic waves in the transducer 16. Acoustic waves traveling upwardly are reflected back into the transducer 16 by the air-metal boundary at the top surface of the top electrode 20. Acoustic waves traveling downwardly are reflected back into the transducer 16 by the reflector 14 or by an air cavity, which is provided just below the transducer in a Film BAW Resonator (FBAR).

The reflector 14 is typically formed by a stack of reflector layers (RL) 28A through 28E (referred to generally as reflector layers 28), which alternate in material composition to produce a significant reflection coefficient at the junction of adjacent reflector layers 28. Typically, the reflector layers 28A through 28E alternate between materials having high and low acoustic impedances, such as tungsten (W) and silicon dioxide (SiO2). While only five reflector layers 28A through 28E are illustrated in FIG. 1, the number of reflector layers 28 and the structure of the reflector 14 will vary from one design to another.

Figure 2:
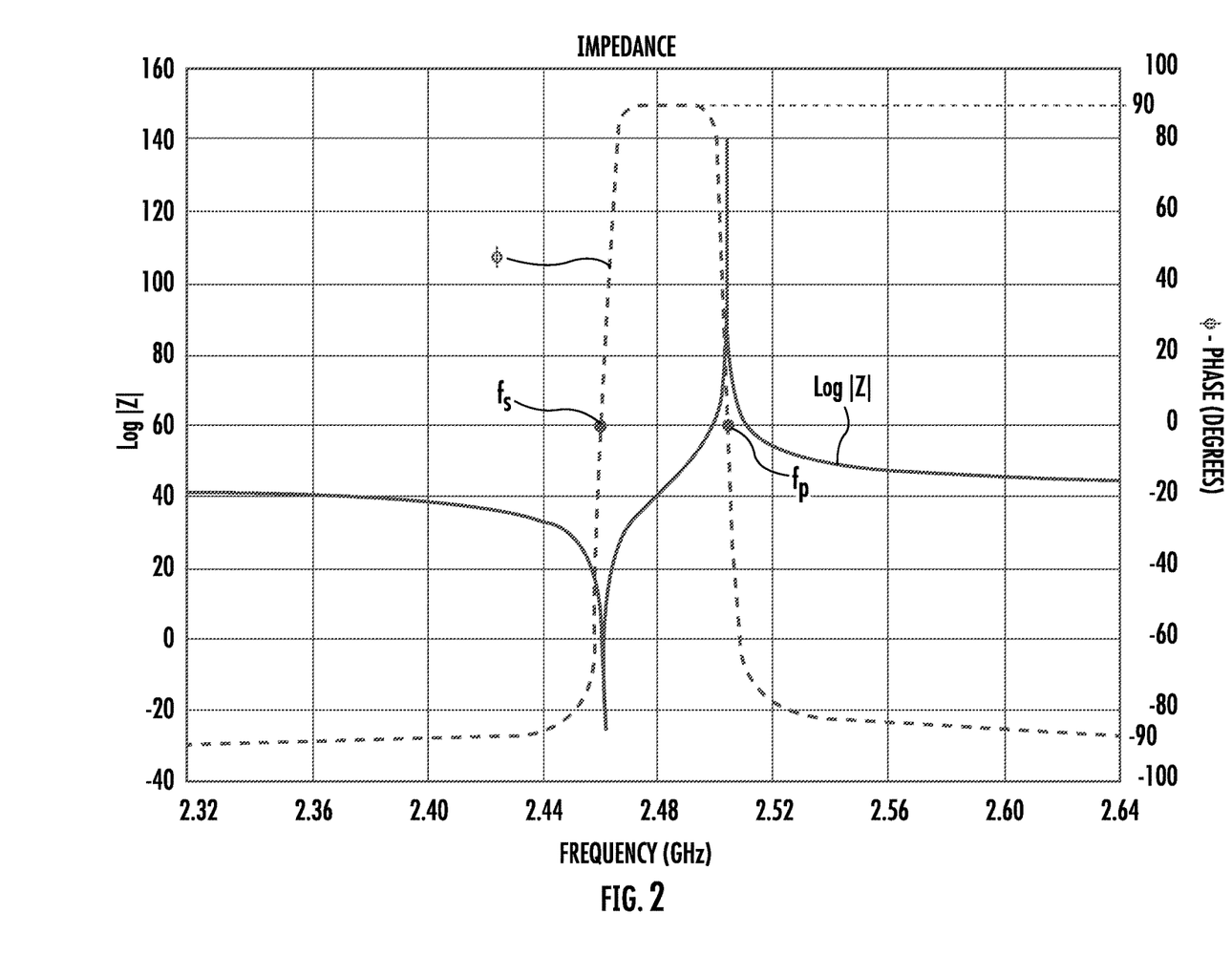
FIG. 2 is a graph of the magnitude and phase of impedance over frequency responses as a function of frequency for an ideal BAW resonator.

The magnitude (Z) and phase (φ) of the electrical impedance as a function of the frequency (GHz) for a relatively ideal BAW resonator 10 are provided in FIG. 2. The magnitude (Z) of the electrical impedance is illustrated by the solid line, while the phase (φ) of the electrical impedance is illustrated by the dashed line. A unique feature of the BAW resonator 10 is that it has both a resonance frequency and an anti-resonance frequency. The resonance frequency is typically referred to as the series resonance frequency (fs), and the anti-resonance frequency is typically referred to as the parallel resonance frequency (fp). The series resonance frequency (fs) occurs when the magnitude of the impedance, or reactance, of the BAW resonator 10 approaches zero. The parallel resonance frequency (fp) occurs when the magnitude of the impedance, or reactance, of the BAW resonator 10 peaks at a significantly high level. In general, the series resonance frequency (fs) is a function of the thickness of the piezoelectric layer 18 and the mass of the bottom and top electrodes 20, 22.

For the phase, the BAW resonator 10 acts like an inductance that provides a 90° phase shift between the series resonance frequency (fs) and the parallel resonance frequency (fp). In contrast, the BAW resonator 10 acts like a capacitance that provides a −90° phase shift below the series resonance frequency (fs) and above the parallel resonance frequency (fp). The BAW resonator 10 presents a very low, near-zero resistance at the series resonance frequency (fs) and a very high resistance at the parallel resonance frequency (fp). The electrical nature of the BAW resonator 10 lends itself to the realization of a very high-quality factor (Q) inductance over a relatively short range of frequencies, which has proven to be very beneficial in high-frequency filter networks, especially those operating at frequencies around 1.8 GHz and above.

Figure 3A:
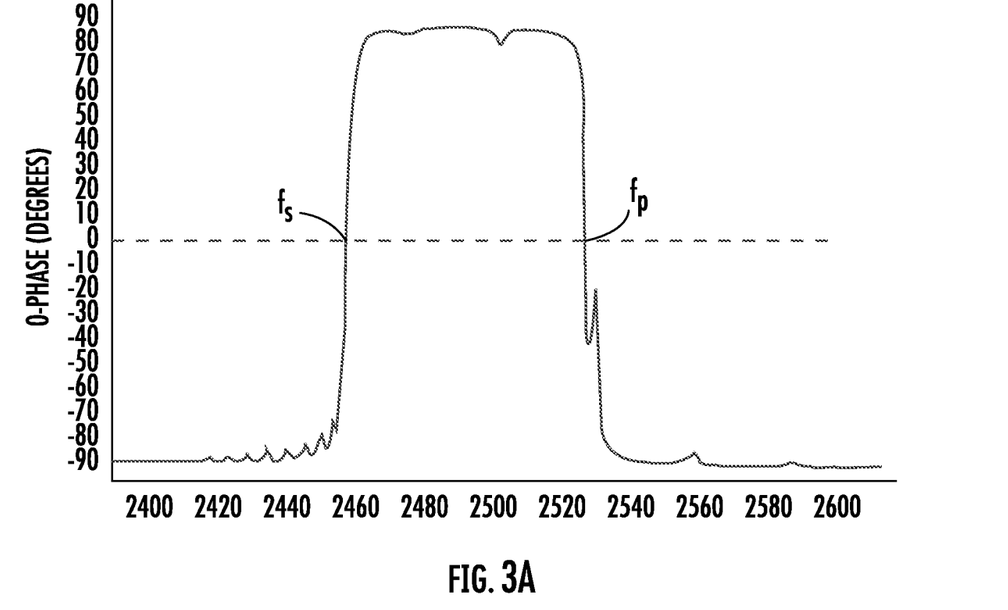
FIGS. 3A-3C are graphs of phase responses for various BAW resonator configurations.

Unfortunately, the phase ($\phi$) curve of FIG. 2 is representative of an ideal phase curve. In reality, approaching this ideal is challenging. A typical phase curve for the BAW resonator 10 of FIG. 1 is illustrated in FIG. 3A. Instead of being a smooth curve, the phase curve of FIG. 3A includes ripple between the series resonance frequency (fs), between the series resonance frequency (fs) and the parallel resonance frequency (fp), and above the parallel resonance frequency (fp). The ripple is the result of spurious modes, which are caused by spurious resonances that occur in corresponding frequencies. While the vast majority of the acoustic waves in the BAW resonator 10 propagate vertically, various boundary conditions about the transducer 16 result in the propagation of lateral (horizontal) acoustic waves, which are referred to as lateral standing waves. The presence of these lateral standing waves reduces the potential quality factor (Q) associated with the BAW resonator 10.

Figure 3B:
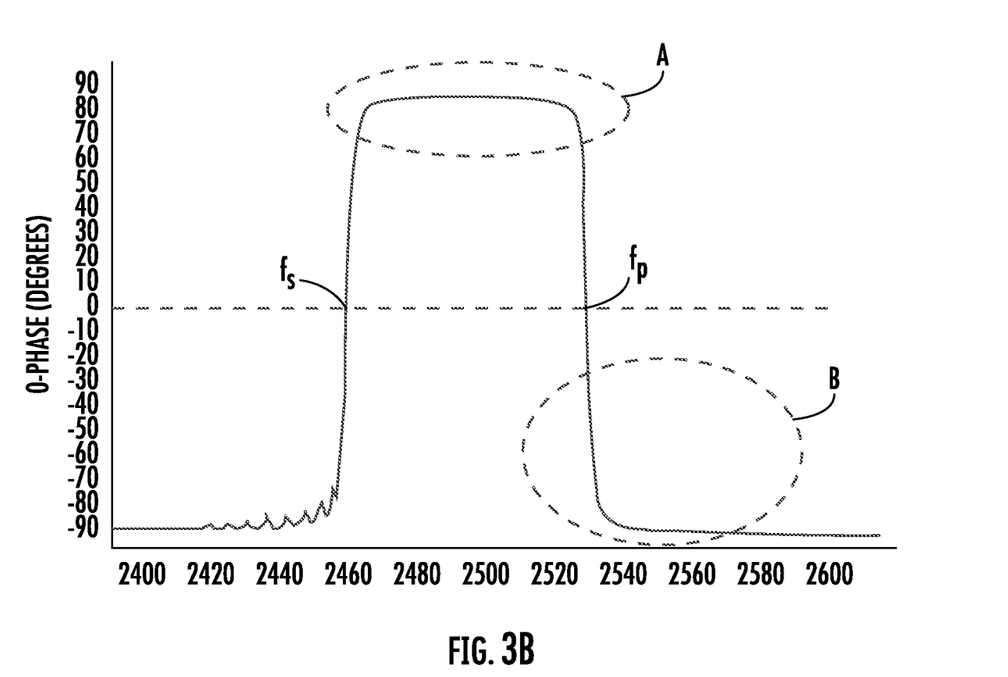
Figure 4:
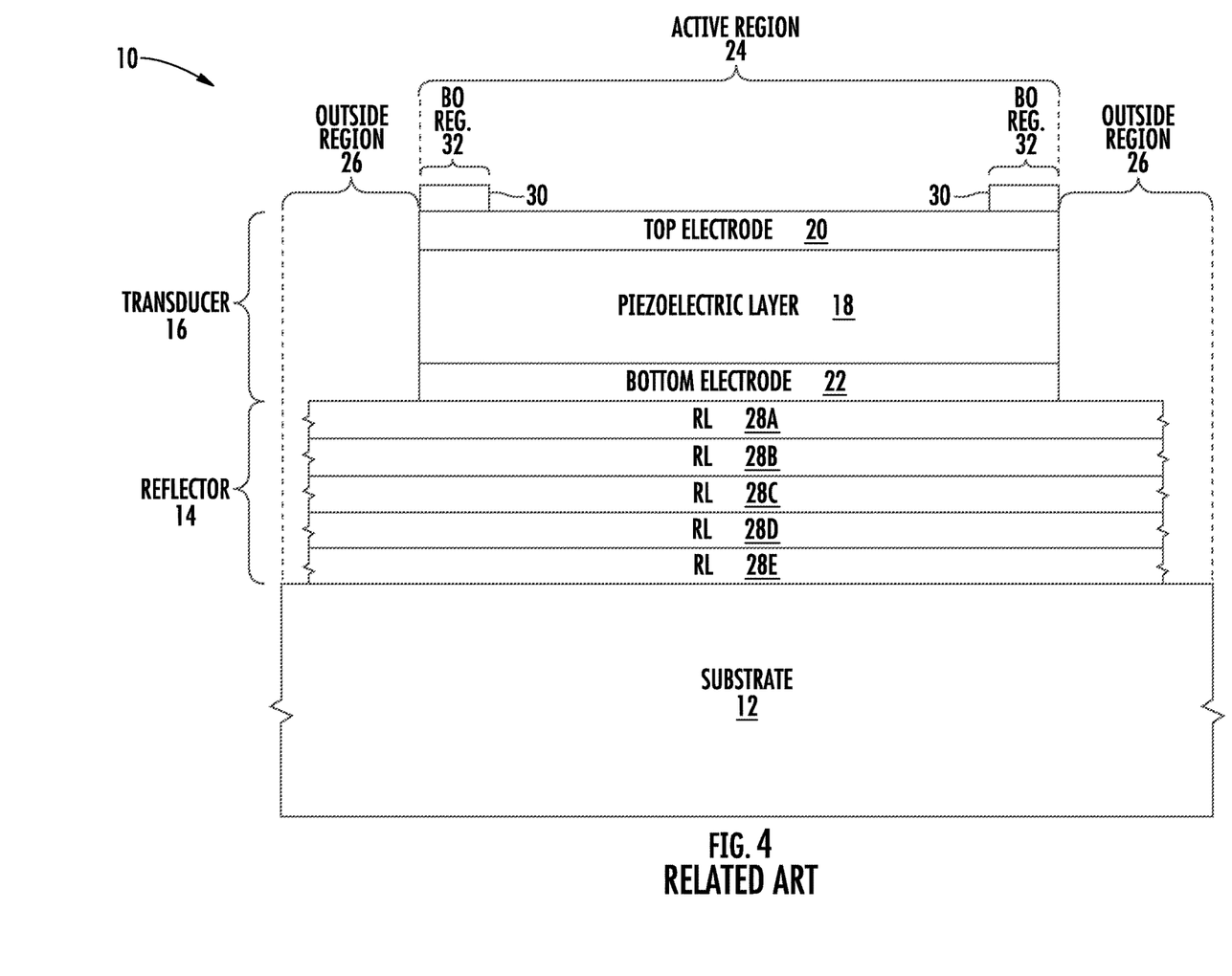
FIG. 4 illustrates a conventional BAW resonator with a border ring.

As illustrated in FIG. 4, a border (BO) ring 30 is formed on or within the top electrode 20 to suppress certain of the spurious modes. The spurious modes that are suppressed by the BO ring 30 are those above the series resonance frequency (fs), as highlighted by circles A and B in the phase curve of FIG. 3B. Circle A shows a suppression of the ripple, and thus the spurious mode, in the passband of the phase curve, which resides between the series resonance frequency (fs) and the parallel resonance frequency (fp). Circle B shows suppression of the ripple, and thus the spurious modes, above the parallel resonance frequency (fp). Notably, the spurious mode in the upper shoulder of the passband, which is just below the parallel resonance frequency (fp), and the spurious modes above the passband are suppressed, as evidenced by the smooth or substantially ripple free phase curve between the series resonance frequency (fs) and the parallel resonance frequency (fp) and above the parallel resonance frequency (fp).

The BO ring 30 corresponds to a mass loading of the portion of the top electrode 20 that extends about the periphery of the active region 24. The BO ring 30 may correspond to a thickened portion of the top electrode 20 or the application of additional layers of an appropriate material over the top electrode 20. The portion of the BAW resonator 10 that includes and resides below the BO ring 30 is referred to as a BO region 32. Accordingly, the BO region 32 corresponds to an outer, perimeter portion of the active region 24 and resides inside the active region 24.

While the BO ring 30 is effective at suppressing spurious modes above the series resonance frequency (fs), the BO ring 30 has little or no impact on those spurious modes below the series resonance frequency (fs), as shown in FIG. 3B. A technique referred to as apodization is often used to suppress the spurious modes that fall below the series resonance frequency (fs).

Figure 3C:
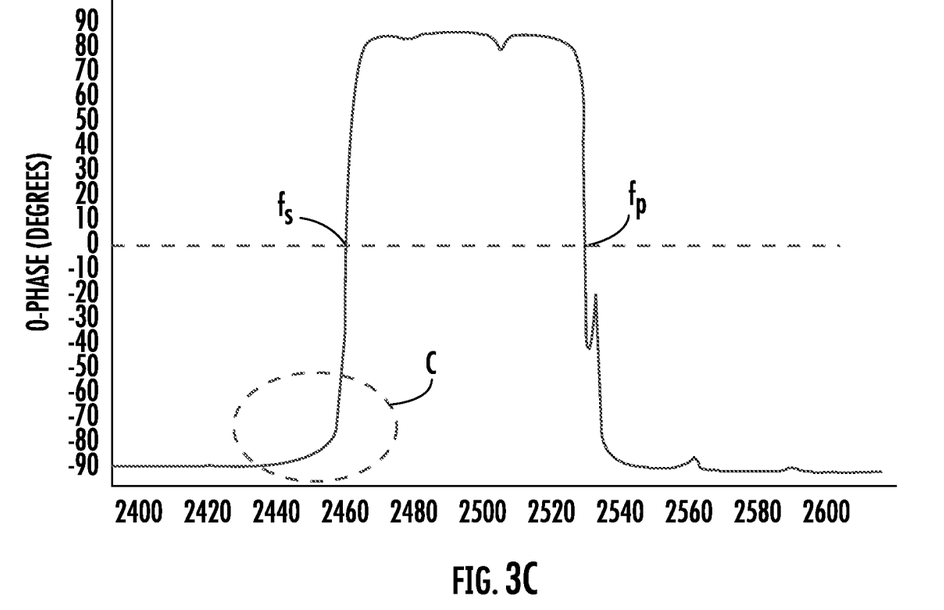

Apodization works to avoid, or at least significantly reduce, any lateral symmetry in the BAW resonator 10, or at least in the transducer 16 thereof. The lateral symmetry corresponds to the footprint of the transducer 16, and avoiding the lateral symmetry corresponds to avoiding symmetry associated with the sides of the footprint. For example, one may choose a footprint that corresponds to a pentagon instead of a square or rectangle. Avoiding symmetry helps reduce the presence of lateral standing waves in the transducer 16. Circle C of FIG. 3C illustrates the effect of apodization in which the spurious modes below the series resonance frequency (fs) are suppressed. Assuming no BO ring 30 is provided, one can readily see in FIG. 3C that apodization fails to suppress those spurious modes above the series resonant frequency (fs). As such, the typical BAW resonator 10 employs both apodization and the BO ring 30.

Figure 5A:
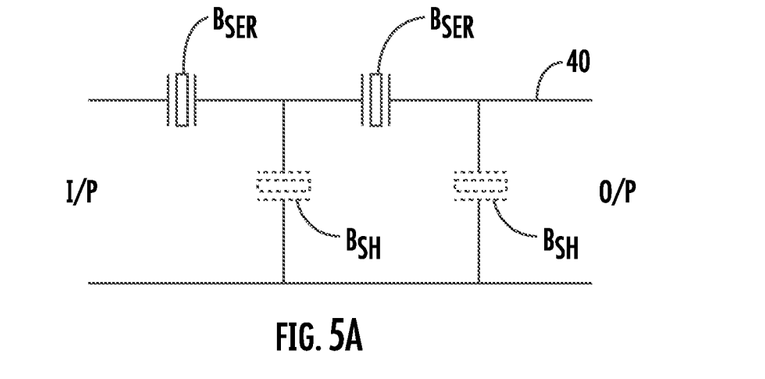
FIG. 5A is a schematic of a conventional ladder network.
Figure 5B:
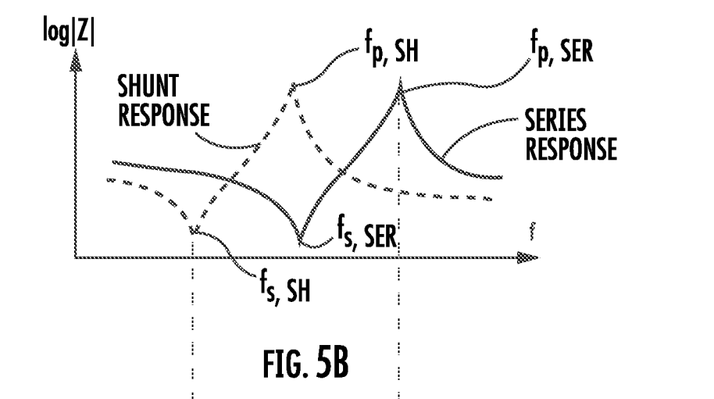
FIGS. 5B and 5C are graphs of a frequency response for BAW resonators in the conventional ladder network of FIG. 5A and a frequency response for the conventional ladder network of FIG. 5A.

As noted above, BAW resonators 10 are often used in filter networks that operate at high frequencies and require high Q values. A basic ladder network 40 is illustrated in FIG. 5A. The ladder network 40 includes two series resonators $B_{SER}$ and two shunt resonators $B_{SH}$, which are arranged in a traditional ladder configuration. Typically, the series resonators $B_{SER}$ have the same or similar first frequency response, and the shunt resonators $B_{SH}$ have the same or similar second frequency response, which is different than the first frequency response, as shown in FIG. 5B. In many applications, the shunt resonators $B_{SH}$ are a detuned version of the series resonators $B_{SER}$. As a result, the frequency responses for the series resonators $B_{SER}$ and the shunt resonators $B_{SH}$ are generally very similar yet shifted relative to one another such that the parallel resonance frequency ($f_{P,SH}$) of the shunt resonators approximates the series resonance frequency ($f_{S,SER}$) of the series resonators $B_{SER}$. Note that the series resonance frequency ($f_{S,SH}$) of the shunt resonators $B_{SH}$ is less than the series resonance frequency ($f_{S,SER}$) of the series resonators $B_{SER}$. The parallel resonance frequency ($f_{P,SH}$) of the shunt resonators $B_{SH}$ is less than the parallel resonance frequency ($f_{P,SER}$) of the series resonators $B_{SER}$.

Figure 5C:
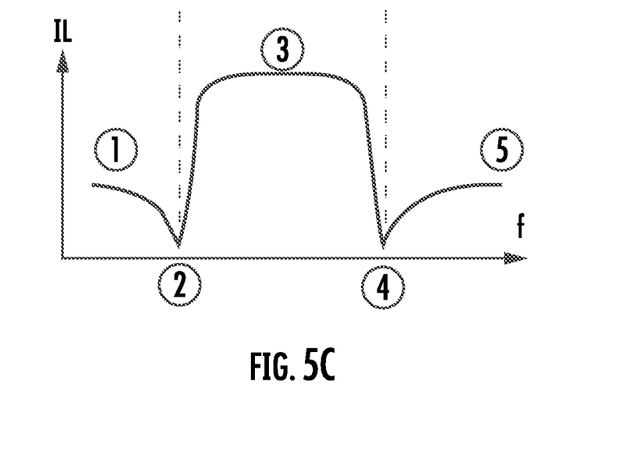

FIG. 5C is associated with FIG. 5B and illustrates the response of the ladder network 40. The series resonance frequency ($f_{S,SH}$) of the shunt resonators $B_{SH}$ corresponds to the low side of the passband's skirt (phase 2), and the parallel resonance frequency ($f_{P,SER}$) of the series resonators $B_{SER}$ corresponds to the high side of the passband's skirt (phase 4). The substantially aligned series resonance frequency ($f_{S,SER}$) of the series resonators $B_{SER}$ and the parallel resonance frequency ($f_{P,SH}$) of the shunt resonators $B_{SH}$ fall within the passband.

FIGS. 6A through 6E provide circuit equivalents for the five phases of the response of the ladder network 40. During the first phase (phase 1, FIGS. 5C, 6A), the ladder network 40 functions to attenuate the input signal. As the series resonance frequency ($f_{S,SH}$) of the shunt resonators $B_{SH}$ is approached, the impedance of the shunt resonators $B_{SH}$ drops precipitously, such that the shunt resonators $B_{SH}$ essentially provide a short to ground at the series resonance frequency ($f_{S,SH}$) of the shunt resonators (phase 2, FIGS. 5C, 6B). At the series resonance frequency ($f_{S,SH}$) of the shunt resonators $B_{SH}$ (phase 2), the input signal is essentially blocked from the output of the ladder network 40.

Figure 6A:
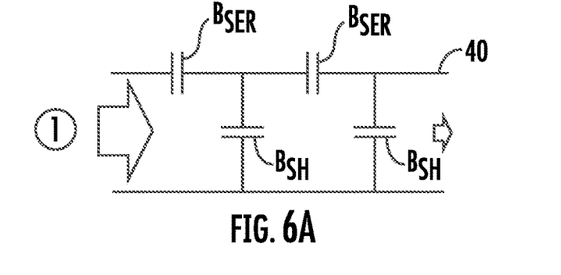
FIGS. 6A-6E are circuit equivalents for the ladder network of FIG. 5A at the frequency points 1, 2, 3, 4, and 5, which are identified in FIG. 5C.
Figure 6B:
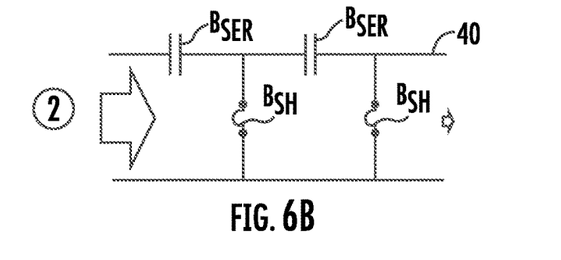
Figure 6C:
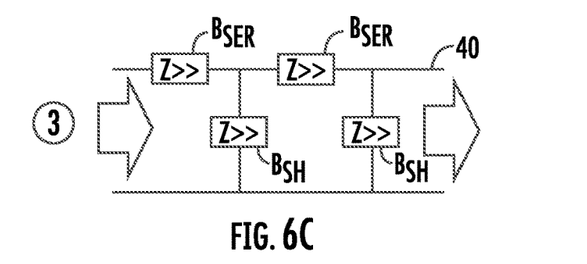
Figure 6D:
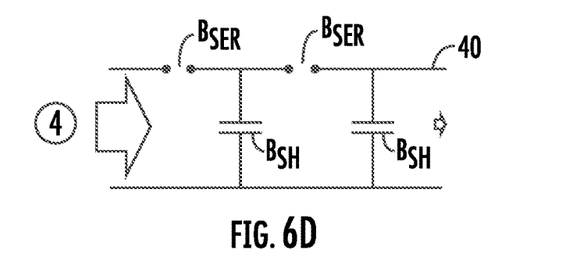
Figure 6E:
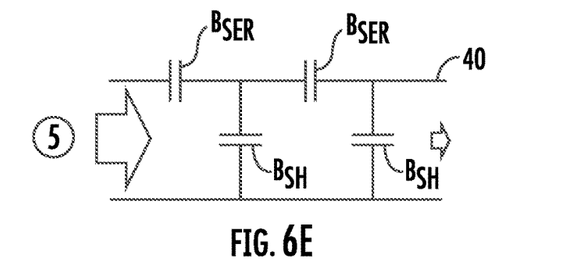

Between the series resonance frequency ($f_{S,SH}$) of the shunt resonators $B_{SH}$ and the parallel resonance frequency ($f_{P,SER}$) of the series resonators $B_{SER}$, which corresponds to the passband, the input signal is passed to the output with relatively little or no attenuation (phase 3, FIGS. 5C, 6C). Within the passband, the series resonators $B_{SER}$ present relatively low impedance, while the shunt resonators $B_{SH}$ present a relatively high impedance, wherein the combination of the two leads to a flat passband was steep low and high-side skirts. As the parallel resonance frequency ($f_{P,SER}$) of the series resonators $B_{SER}$ is approached, the impedance of the series resonators $B_{SER}$ becomes very high, such that the series resonators $B_{SER}$ essentially present themselves as an opening at the parallel resonance frequency ($f_{P,SER}$) of the series resonators (phase 4, FIGS. 5C, 6D). At the parallel resonance frequency ($f_{P,SER}$) of the series resonators $B_{SER}$ (phase 4), the input signal is again essentially blocked from the output of the ladder network 40. During the final phase (phase 5, FIGS. 5C, 6E), the ladder network 40 functions to attenuate the input signal in a similar fashion to that provided in phase 1. As the parallel resonance frequency ($f_{P,SER}$) of the series resonators $B_{SER}$ is passed, the impedance of the series resonators $B_{SER}$ decreases, and the impedance of the shunt resonators $B_{SH}$ normalizes. Thus, the ladder network 40 functions to provide a high Q passband between the series resonance frequency ($f_{S,SH}$) of the shunt resonators $B_{SH}$ and the parallel resonance frequency ($f_{P,SER}$) of the series resonators $B_{SER}$. The ladder network 40 provides extremely high attenuation at both the series resonance frequency ($f_{S,SH}$) of the shunt resonators $B_{SH}$ and the parallel resonance frequency ($f_{P,SER}$) of the series resonators. The ladder network 40 provides good attenuation below the series resonance frequency ($f_{S,SH}$) of the shunt resonators $B_{SH}$ and above the parallel resonance frequency ($f_{P,SER}$) of the series resonators $B_{SER}$.

Having provided an overview of BAW resonators and filters that employ BAW resonators, FIGS. 7A-11 discuss details of a BAW assist filter structure.

Figure 7:
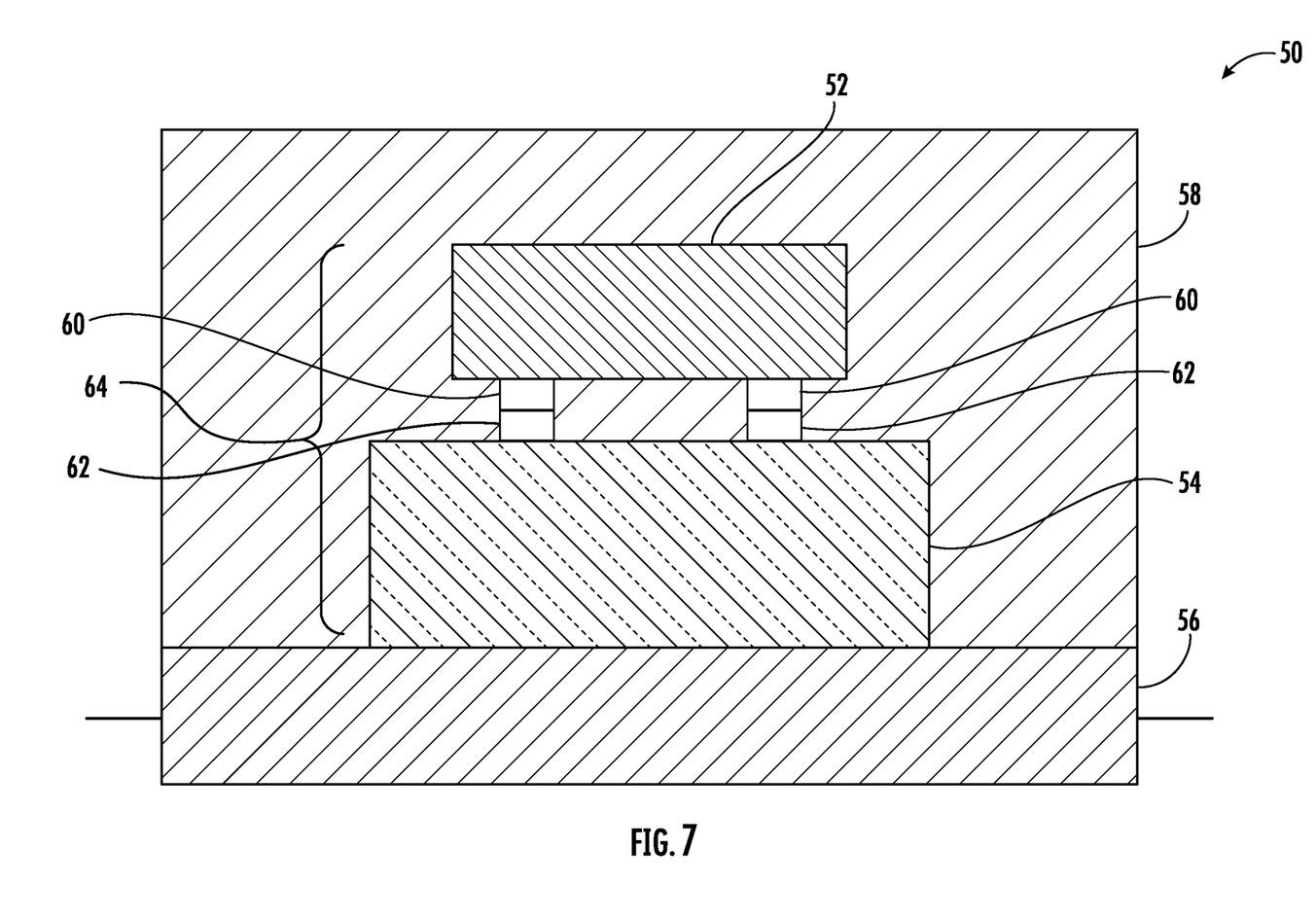
FIG. 7 is a cross-sectional side view of a BAW assist filter structure with a BAW resonator stacked onto an integrated passive device (IPD).

FIG. 7 is a cross-sectional side view of a BAW assist filter structure 50 with a BAW filter structure 52 (may also be referred to as a BAW die) stacked onto an integrated passive device (IPD) 54. The BAW filter structure 52 includes one or more BAW resonators 10 (see FIG. 1). In particular, the BAW assist filter structure 50 includes a base layer 56, the IPD 54 over the base layer 56, and the BAW resonator 52 over the IPD 54. In certain embodiments, the base layer 56 includes a laminate (e.g., radio frequency (RF) laminate) or printed circuit board (PCB). Further, in certain embodiments, the BAW assist filter structure includes a cover 58 (e.g., plastic covering) covering at least a portion of the BAW filter structure 52, IPD 54, and/or base layer 56.

As noted above, each BAW resonator 10 of the BAW filter structure 52 includes a substrate 12 and a transducer 16 over the substrate 12. The transducer 16 includes a top electrode 20, a bottom electrode 22, and a piezoelectric layer 18 between the top electrode 20 and the bottom electrode 22. The BAW resonators 10 of the BAW filter structure 52 may share a common substrate 12, top electrode 20, bottom electrode 22, and/or piezoelectric layer 18. Further, the BAW filter structure 52 includes conductive pillars 60 for electrically coupling to the IPD 54. In certain embodiments, the BAW filter structure 52 includes a BAW solidly mounted resonator (SMR). In certain embodiments, the BAW filter structure 52 is fabricated on a die including a silicon carrier wafer with a plurality of BAW resonators 10 (e.g., BAW-SMR resonators), where the die further includes the conductive pillars 60 (e.g., copper pillars).

The IPD 54 includes an electrical circuit electrically coupled to the BAW filter structure 52. In certain embodiments, the IPD 54 includes conductive landing pads 62 (may also be referred to as conductive vias) configured to electrically couple to the BAW filter structure 52. In particular, the conductive landing pads 62 (e.g., copper landing pads) of the IPD 54 are aligned with and contact (e.g., solder bonded) the conductive pillars 60 of the BAW filter structure 52. In certain embodiments, the IPD 54 includes a glass IPD; however, other high Q materials may be used. In certain embodiments, the IPD 54 includes LC elements (inductor and capacitor elements) fabricated on a die of photo defined and etchable glass.

In certain embodiments, the BAW filter structure 52 is flipped on to an IPD 54 to form a stacked die 64. The internal electrical nodes of the BAW filter structure 52 (e.g., the BAW resonators 10 thereof) and/or IPD 54 are easily accessible, allowing for flexibility of filter topologies. The stacked die 64 may then be soldered (may also be referred to as solder bonded) to a base layer 56, such as a laminate (e.g., radio frequency (RF) laminate) or printed circuit board (PCB).

The stacked die 64 of the BAW filter structure 52 and IPD 54 are able to handle higher frequencies (e.g., above 6 GHz) than the BAW resonators 10 would be able to handle themselves. In particular, stacking of the BAW filter structure 52 onto the IPD 54 reduces the transmission lines from the BAW filter structure 52 to the IPD 54, which increases Q. Accordingly, the BAW assist filter structure 50 is able to filter high frequencies with high Q. In certain embodiments, the stacked die 64 (e.g., BAW filter structure 52 and/or IPD 54) includes an elliptic filter. An elliptic filter is a signal processing filter with equalized ripple behavior in both the passband and the stopband. The amount of ripple in each band is independently adjustable. In certain embodiments, the IPD 54 is a passband filter, including a high-pass filter or a low-pass filter (e.g., a high-pass elliptic filter, low-pass elliptic filter, etc.).

Figure 8:
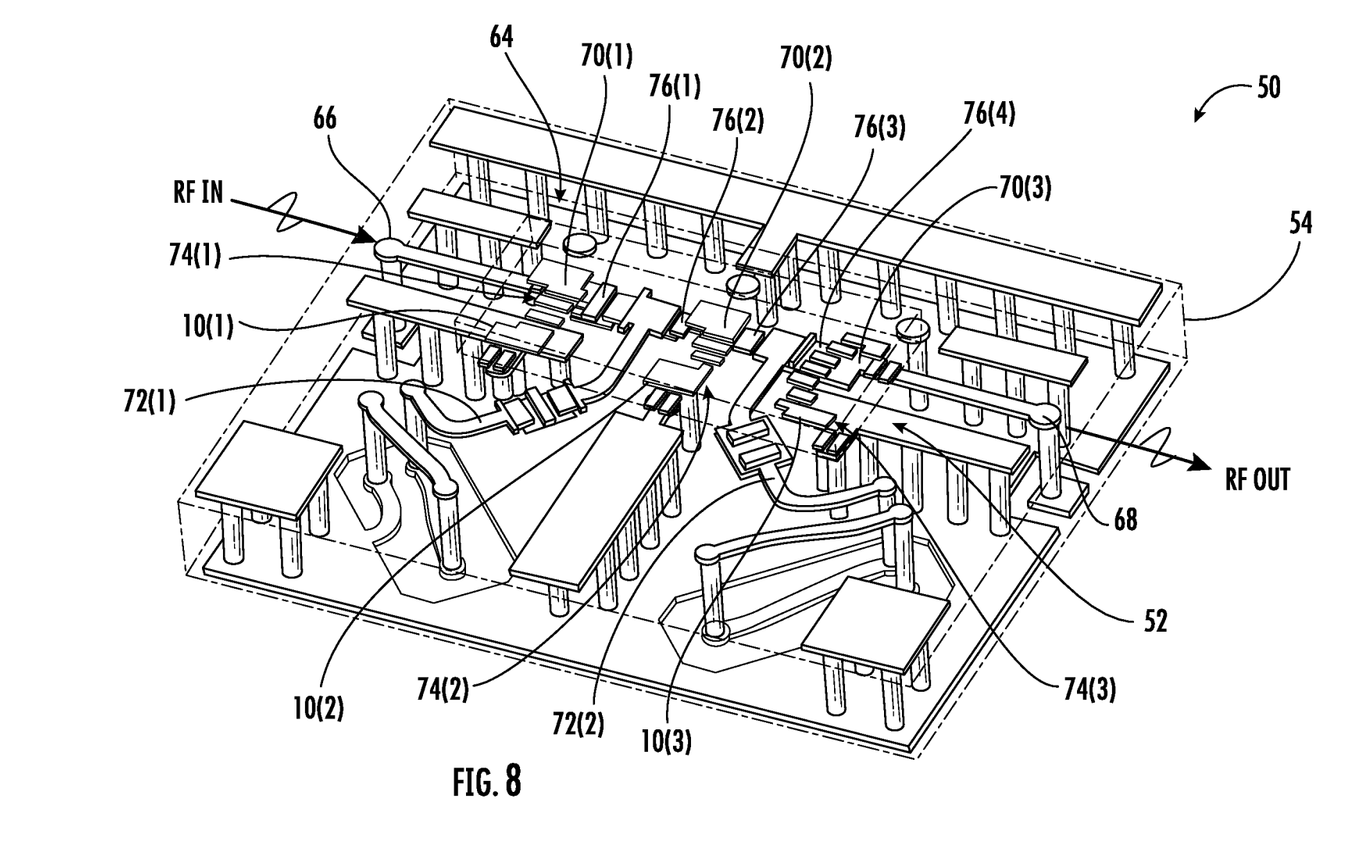
FIG. 8 is a perspective view of an exemplary embodiment of the BAW assist filter structure of FIG. 7.

FIG. 8 is a perspective view of an exemplary embodiment of the BAW assist filter structure of FIG. 7. In particular, as discussed above, a BAW filter structure 52 is stacked onto the IPD 54 to form a stacked die 64. As noted above, the BAW filter structure 52 includes conductive pillars 60 (see FIG. 7) aligned with and electrically coupled to the conductive landing pads 62 (see FIG. 7) of the IPD 54. The IPD 54 is configured to receive an RF signal input 66 (e.g., at an input planar waveguide) and send an RF signal output 68 (e.g., at an output planar waveguide). The BAW filter structure 52 is electrically coupled to the IPD 54 at two or more junctions 70(1)-70(3) downstream from the RF signal input 66 (between the RF signal input 66 and the RF signal output 68). In particular, the BAW filter structure 52 includes BAW resonators 10(1)-10(3) electrically coupled respectively at each of the junctions 70(1)-70(3).

In certain embodiments, BAW resonators 10(1)-10(3) of the BAW filter structure 52 are shunt BAW resonators 10(1)-10(3) in electrical communication with shunt LC tank circuits 72(1), 72(2) (including an inductor and a capacitor). BAW resonators 10(1)-10(3) each respectively form BAW resonator branches 74(1)-74(3). The shunt BAW resonator 10(1)-10(3) and/or shunt LC tank circuits 72(1), 72(2) are configured to create a low-resistance path for electric current.

The IPD includes a series capacitor 76(1)-76(4) (e.g., high Q capacitor) in between each of the BAW resonator branches 74(1)-74(3). The series capacitor 76(1)-76(4) couples the energy between the RF input 66 and the RF output 68.

In certain embodiments, the IPD 54 includes vias (e.g., through glass vias) that enable propagation of RF signals from the top of the IPD 54 to the bottom of the IPD 54. Further, the vias conduct heat and/or provide high Q for inductors.

Figure 9:
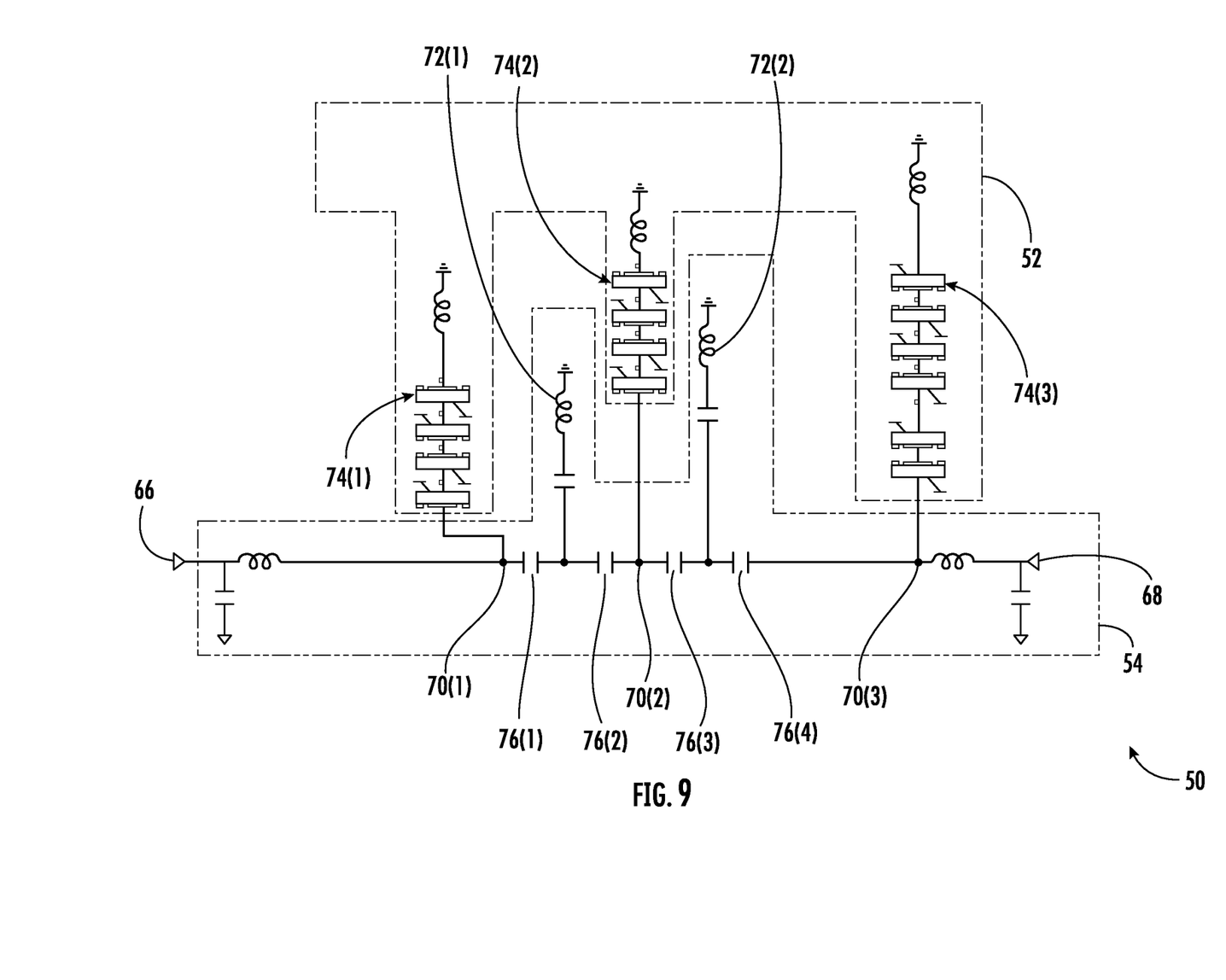
FIG. 9 is a circuit diagram illustrating bifurcation of an electrical filter circuit between the BAW resonator and the IPD of the BAW assist filter structure of FIGS. 7 and 8.

FIG. 9 is a circuit diagram illustrating bifurcation of an electrical filter circuit between the BAW filter structure 52 and the IPD 54 of the BAW assist filter structure 50 of FIGS. 7 and 8.

As noted above, the BAW filter structure 52 is stacked onto the IPD 54 to form a stacked die 64. The IPD 54 is configured to receive an RF signal input 66, and the BAW filter structure 52 is electrically coupled to the IPD 54 at three junctions 70(1)-70(3) downstream from the RF signal input 66. In other words, the coupling of the conductive landing pads 62 (see FIG. 7) to the pillars 60 (see FIG. 7) are at each of the junctions 70(1)-70(3). Further, the BAW resonators 10 of the BAW filter structure 52 are shunt BAW resonators in electrical communication with shunt LC tank circuits 72(1), 72(2) (including an inductor and a capacitor) provided in the IPD 54. The IPD 54 includes a series capacitor 76(1)-76(4) in between each of the BAW resonator branches 74(1)-74(3).

The resulting signal path involves an input RF signal 66 propagating to the first junction 70(1), where a first signal portion propagates through the first BAW resonator branches 74(1) to ground, and a remaining main signal portion propagates through the first series capacitor 76(1). A second signal portion then propagates through the first shunt LC tank circuit 72(1), and a remaining main signal portion propagates through the second series capacitor 76(2). A third signal portion then propagates through the second BAW resonator branch 74(2) to ground, and a remaining main signal portion propagates through the third series capacitor 76(3). A fourth signal portion then propagates through the second shunt LC tank circuit 72(2), and a remaining main signal portion propagates through the fourth series capacitor 76(4). A fifth signal portion then propagates through the third BAW resonator branch 74(3) to ground, and a remaining main signal portion propagates as an output RF signal 68.

As a result, the BAW assist filter structure has a low insertion loss. In particular, high Q inductor and capacitor structure of a glass IPD 54 can be leveraged in the design and distributed in the internal nodes of filter network efficiently and in close electrical proximity to high-Q BAW resonators 10 due to stacking. The BAW assist filter structure has a high frequency of operation. In particular, high self-resonance (SRF) characteristics of the glass IPD 54 and the three-dimensional inductor structure can be leveraged in the design topology leading to higher frequency filters (e.g., above 6 GHz).

The BAW assist filter structure 50 has a transfer function usefulness. In particular, electrical length parasitic mitigation has been achieved by virtue of die stacking and short interconnect length. RF grounding and RF ground coupling become dominant in high-frequency regimes where the electrical length of interconnects significantly impacts the filter RF transfer function.

The BAW assist filter structure 52 provides flexible filter topologies as die stacking allows for greater flexibility in the design of the filter transfer function. The BAW filter structure enables high pass and low pass quasi-elliptical filter topologies and wider achievable bandwidth. This is an advantage over bandwidth limitations of other bandpass ladder structures of BAW resonators, where fixed impedance characteristic intrinsic of acoustic resonators where shunt and series resonance are fixed by acoustic coupling factor (k2eff).

Figure 10:
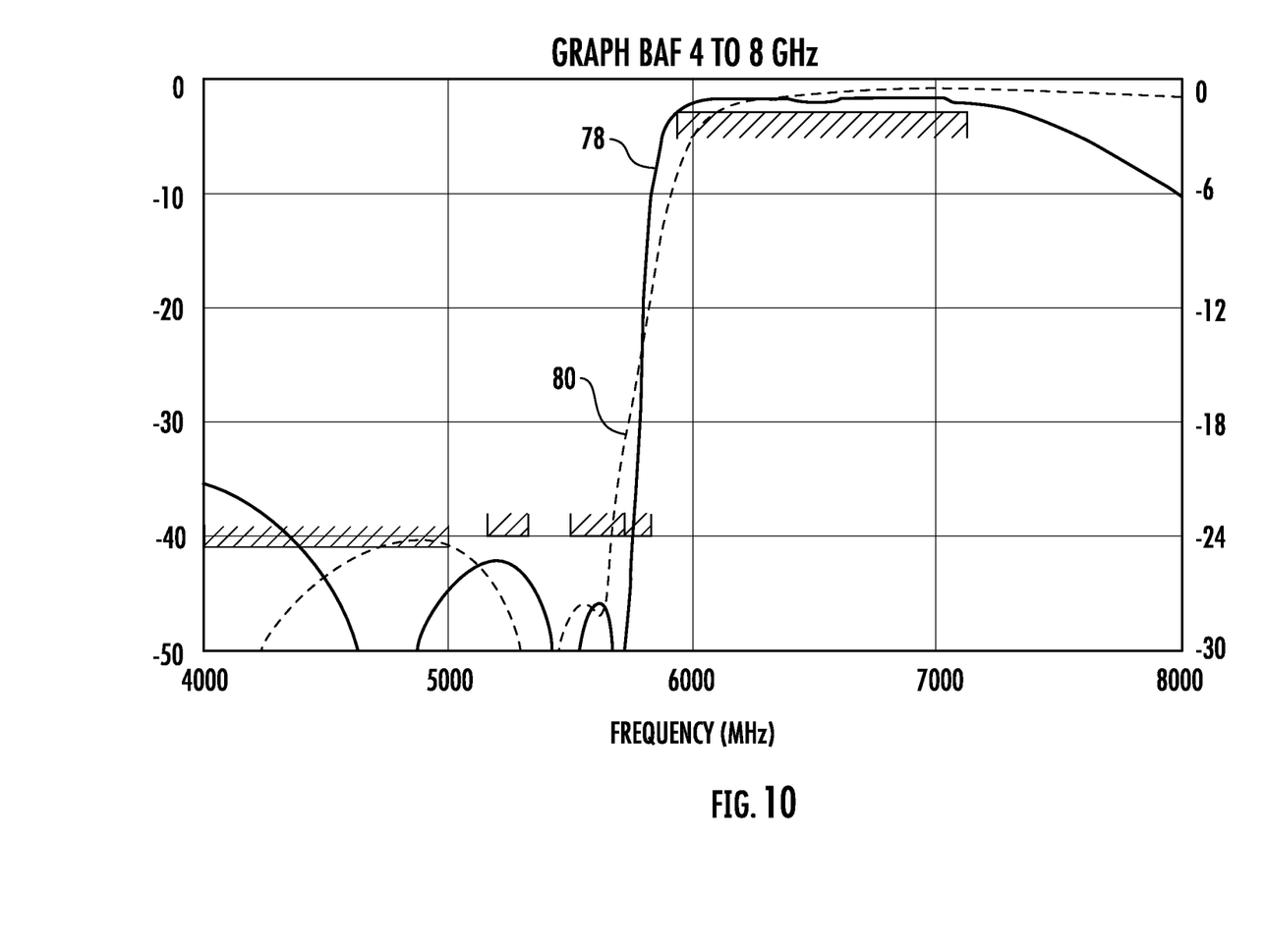
FIG. 10 is a graph illustrating performance improvement of the BAW assist filter structure of FIGS. 7-9 compared to a BAW filter structure without an IPD.

FIG. 10 is a graph illustrating performance improvement of the BAW assist filter structure of FIGS. 7-9 compared to a BAW filter structure without an IPD. In particular, the graph illustrates a transfer function illustrating wide bandwidths and high-frequency of operation of the BAW filter structure 78 relative to similar order LC high-pass filter 80. As illustrated, the BAW assist filter structure provides a steeper skirt with a wider bandwidth. In certain embodiments, the BAW assist filter structure has a fractional bandwidth between 15-25%. In certain embodiments, the fractional bandwidth is between 18-22%. In certain embodiments, the fractional bandwidth is about 21%. The BAW assist filter structure provides low loss and steep transitions.

Figure 11:
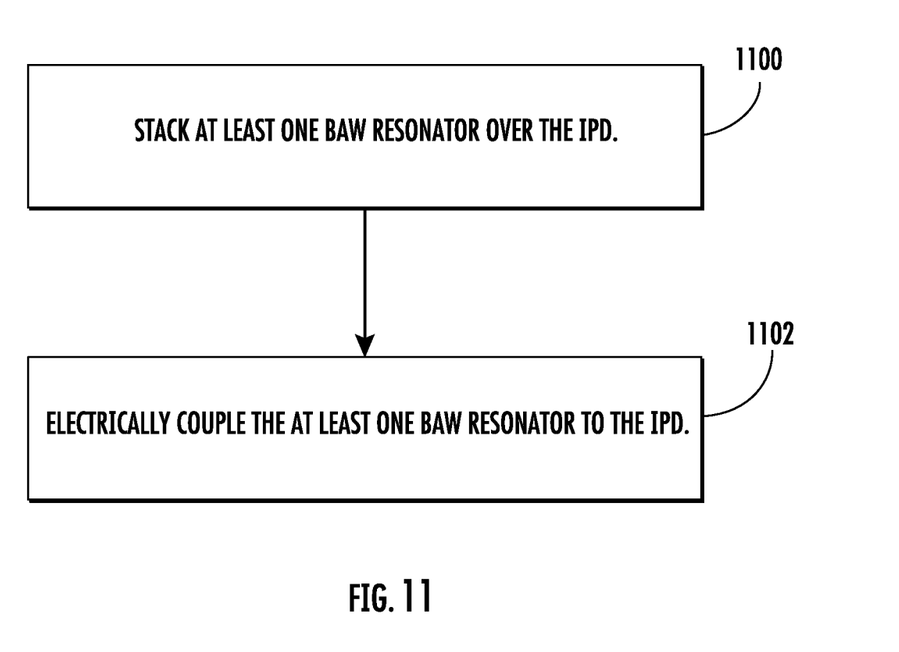
FIG. 11 is a flowchart of steps for manufacturing the BAW assist filter structure of FIGS. 7-10.

FIG. 11 is a flowchart of steps for manufacturing the BAW assist filter structure of FIGS. 7-10. Step 1100 includes stacking at least one BAW resonator over the IPD. The BAW resonator includes a substrate, at least one transducer, the at least one transducer comprising a first electrode, a second electrode, and a piezoelectric layer between the first electrode and the second electrode. Step 1102 includes electrically coupling the at least one BAW resonator to the IPD.

In certain embodiments, the at least one IPD includes a glass IPD. In certain embodiments, the IPD includes a series capacitor. In certain embodiments, the IPD includes a shunt LC tank circuit. In certain embodiments, the IPD includes a series capacitor and a shunt LC tank circuit. In certain embodiments, the IPD includes conductive landing pads for electrically coupling to the at least one BAW resonator. In certain embodiments, the at least one BAW resonator comprises pillars for electrically coupling to the IPD. In certain embodiments, the IPD comprises conductive landing pads, and the at least one BAW resonator includes pillars aligned with and electrically coupled to the conductive landing pads of the IPD. In certain embodiments, the IPD is configured to receive an RF signal input, and the at least one BAW resonator is electrically coupled to the IPD at two or more junctions downstream from the RF signal input.

Those skilled in the art will recognize improvements and modifications to the preferred embodiments of the present disclosure. All such improvements and modifications are considered within the scope of the concepts disclosed herein and the claims that follow.

What is claimed is:

1. A bulk acoustic wave (BAW) assist filter structure, comprising:
   at least one integrated passive device (IPD) including an electrical circuit;
   at least one BAW resonator over the at least one IPD and comprising:
      a substrate; and
      at least one transducer over the substrate, the at least one transducer comprising:
         a first electrode;
         a second electrode; and
         a piezoelectric layer between the first electrode and the second electrode and wherein the electrical circuit of the at least one IPD is electrically coupled to
      the at least one BAW resonator;
   wherein the at least one IPD comprises conductive landing pads; and
   wherein the at least one BAW resonator comprises pillars aligned with and electrically coupled to the conductive landing pads of the at least one IPD.

2. The BAW assist filter structure of claim 1, wherein the at least one IPD comprises a glass IPD.

3. The BAW assist filter structure of claim 1, wherein the at least one IPD comprises an elliptic filter.

4. The BAW assist filter structure of claim 1, wherein the at least one IPD comprises at least one of a high-pass filter or a low-pass filter.

5. The BAW assist filter structure of claim 1, wherein the at least one IPD comprises a series capacitor.

6. The BAW assist filter structure of claim 1, wherein the at least one IPD comprises a shunt LC tank circuit.

7. The BAW assist filter structure of claim 1, wherein the at least one IPD comprises a series capacitor and a shunt LC tank circuit.

8. The BAW assist filter structure of claim 1, wherein the at least one IPD comprises the conductive landing pads for electrically coupling to the at least one BAW resonator.

9. The BAW assist filter structure of claim 1, wherein the at least one BAW resonator comprises the pillars for electrically coupling to the at least one IPD.

10. The BAW assist filter structure of claim 1, wherein the at least one IPD is configured to receive an RF signal input, and the at least one BAW resonator is electrically coupled to the at least one IPD at two or more junctions downstream from the RF signal input.

11. A method of manufacturing a bulk acoustic wave (BAW) assist filter structure, comprising:
    stacking at least one BAW resonator over at least one integrated passive device (IPD), the at least one BAW resonator comprising a substrate, at least one transducer over the substrate, the at least one transducer comprising a first electrode, a second electrode, and a piezoelectric layer between the first electrode and the second electrode; and
    electrically coupling the at least one BAW resonator to an electrical circuit of the at least one IPD, wherein the at least one IPD comprises conductive landing pads and wherein the at least one BAW resonator comprises pillars aligned with and electrically coupled to the conductive landing pads of the at least one IPD.

12. The method of claim 11, wherein the at least one IPD comprises a glass IPD.

13. The method of claim 11, wherein the at least one IPD comprises a series capacitor.

14. The method of claim 11, wherein the at least one IPD comprises a shunt LC tank circuit.

15. The method of claim 11, wherein the at least one IPD comprises a series capacitor and a shunt LC tank circuit.

16. The method of claim 11, wherein the at least one IPD comprises the conductive landing pads for electrically coupling to the at least one BAW resonator.

17. The method of claim 11, wherein the at least one BAW resonator comprises the pillars for electrically coupling to the at least one IPD.

18. The method of claim 11, wherein the at least one IPD is configured to receive an RF signal input, and the at least one BAW resonator is electrically coupled to the at least one IPD at two or more junctions downstream from the RF signal input.

* * * * *